(12) United States Patent
Barth, Jr. et al.

(10) Patent No.: US 7,382,672 B2
(45) Date of Patent: Jun. 3, 2008

(54) DIFFERENTIAL AND HIERARCHICAL SENSING FOR MEMORY CIRCUITS

(75) Inventors: John Edward Barth, Jr., Williston, VT (US); Paul C. Parries, Wappingers Falls, NY (US); William Robert Reohr, Ridgefield, CT (US); Matthew R. Wordeman, Kula, HI (US)

(73) Assignee: International business Machines Corporation, Armonk, NY (US)

( * ) Notice: Subject to any disclaimer, the term of this patent is extended or adjusted under 35 U.S.C. 154(b) by 0 days.

(21) Appl. No.: 11/754,422

(22) Filed: May 29, 2007

(65) Prior Publication Data

US 2007/0223298 A1 Sep. 27, 2007

Related U.S. Application Data

(62) Division of application No. 11/190,542, filed on Jul. 27, 2005, now Pat. No. 7,286,385.

(51) Int. Cl.
*G11C 7/02* (2006.01)
(52) U.S. Cl. ..................................... 365/208; 365/207
(58) Field of Classification Search ................ 365/208, 365/203, 207
See application file for complete search history.

(56) References Cited

U.S. PATENT DOCUMENTS 5,327,317 A * 7/1994 Lee .............................. 361/88
5,748,556 A * 5/1998 Iyengar ................. 365/230.06

* cited by examiner

*Primary Examiner*—A. Zarabian
*Assistant Examiner*—Fernando N Hidalgo
(74) *Attorney, Agent, or Firm*—Ryan, Mason & Lewis, LLP

(57) ABSTRACT

A memory circuit includes multiple word lines, multiple pairs of complementary bank bit lines, multiple block select lines, and multiple of block circuits. Each of the block circuits includes a local bit line; a first transistor having a control terminal connected to the local bit line, a first bias terminal connected to a first bank bit line of a given pair of bank bit lines, and a second bias terminal connecting to a first voltage source; a second transistor having a control terminal connected to a corresponding one of the block select lines, a first bias terminal connected to a second bank bit line of the given pair of bank bit lines, and a second bias terminal connected to the local bit line; and a plurality of memory cells connected to the local bit line and to respective word lines in the memory circuit. At least two block circuits are connected to a given pair of bank bit lines, the block circuits being configured such that a load on each bank bit line in the given pair of bank bit lines is substantially matched to one another.

1 Claim, 9 Drawing Sheets

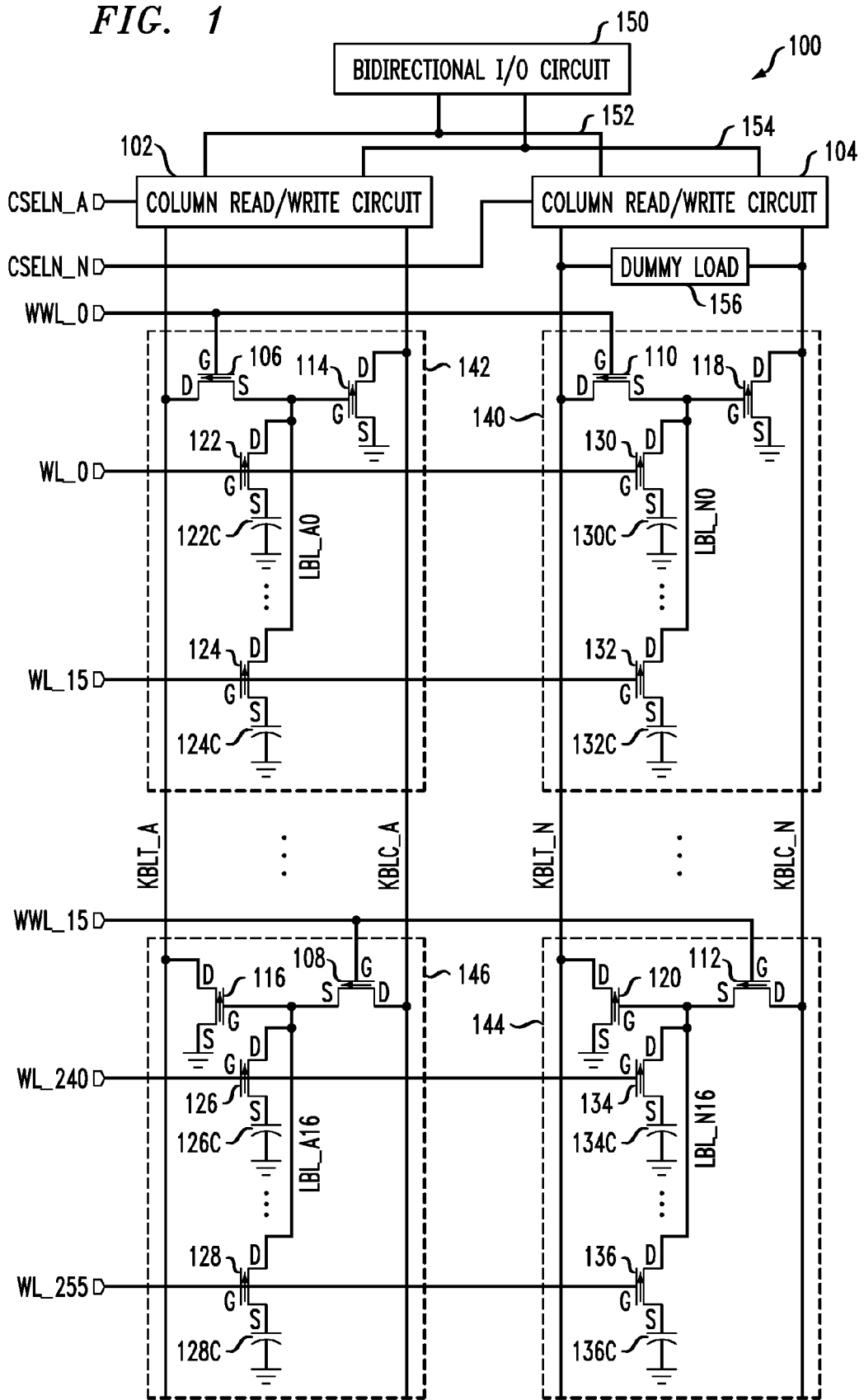

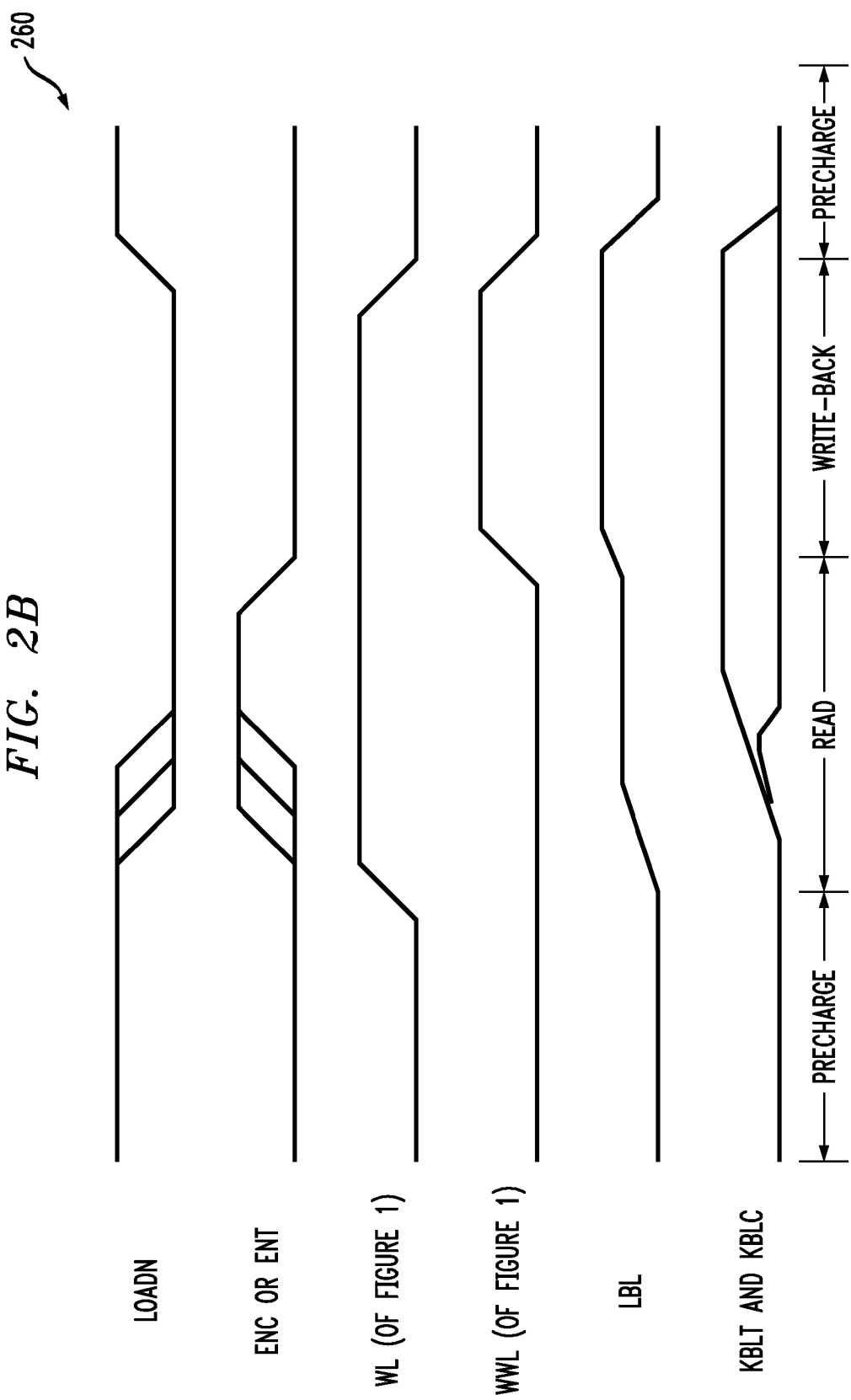

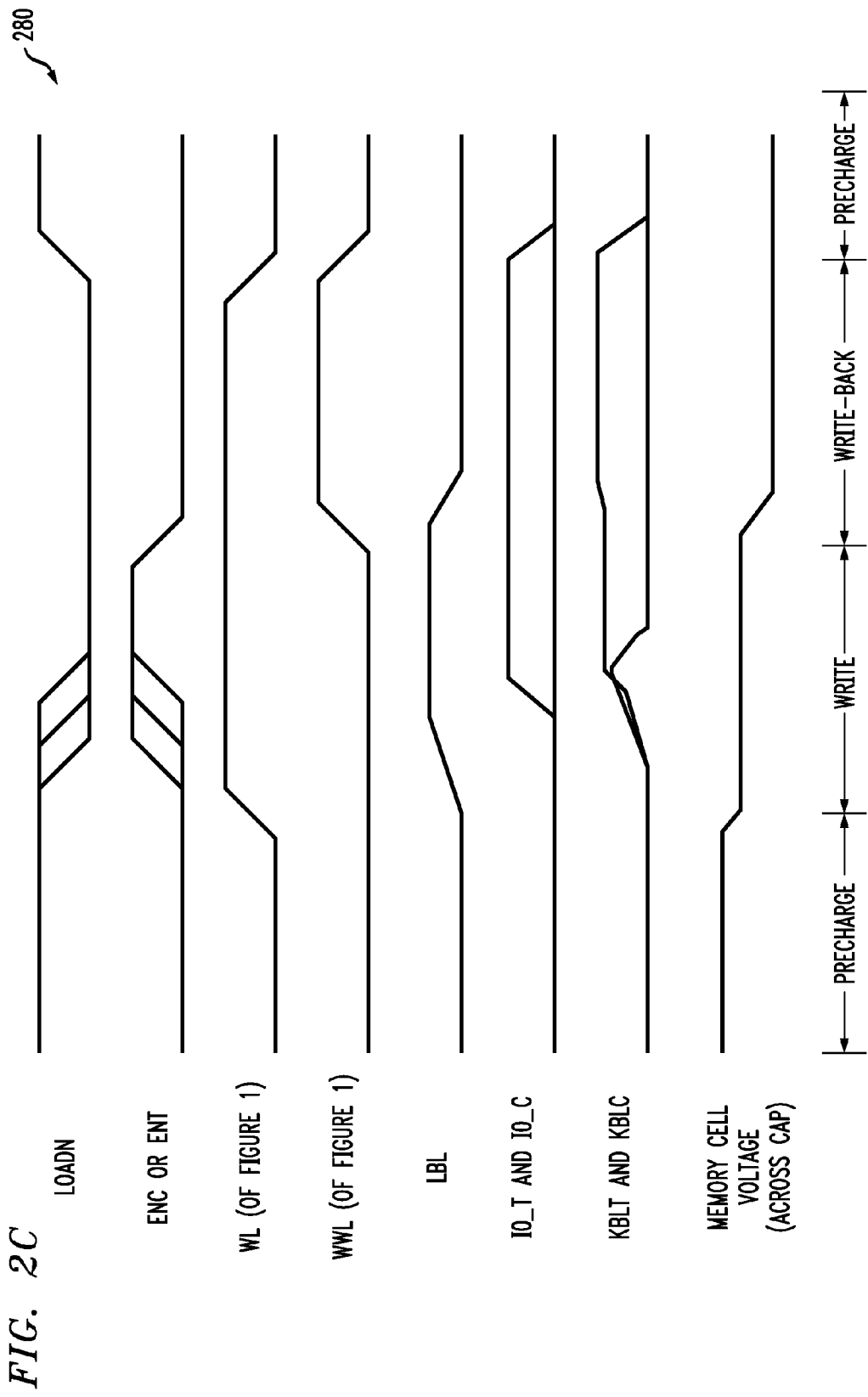

DIFFERENTIAL AND HIERARCHICAL SENSING FOR MEMORY CIRCUITS

CROSS REFERENCE TO RELATED APPLICATION

This application is a divisional of pending U.S. application Ser. No. 11/190,542, filed Jul. 27, 2005, now U.S. Pat. No. 7,286,385 the disclosure of which is incorporated by reference herein.

FIELD OF THE INVENTION

The present invention relates generally to memory devices, and more particularly relates to techniques for improving latency and/or noise immunity in a memory circuit.

BACKGROUND OF THE INVENTION

Memory circuits, including, for example, dynamic random access memory (DRAM), are employed in a wide variety of devices and applications. As memory access time requirements are pushed faster and noise immunity requirements are increased, the design of memory circuit architectures to meet such requirements becomes significantly more challenging. Additionally, memory sizes requirements are continuously increasing, thereby exacerbating speed and noise immunity problems.

Various memory architectures have been proposed to meet certain design criteria, such as, for example, memory access time, often measured as latency. However, although these known memory architectures have had some successes at reducing memory latency, they have often achieved such a reduction in memory latency at the expense of other important design criteria, such as, for example, memory density, noise immunity, power consumption, etc., which are often mutually exclusive design characteristics in a given memory architecture.

Accordingly, there exists a need for a memory circuit that does not suffer from one or more of the problems exhibited by conventional memory architectures.

SUMMARY OF THE INVENTION

The present invention meets the above-noted need by providing, in an illustrative embodiment, a memory circuit including a hierarchical sensing architecture which beneficially reduces latency and/or improves noise immunity in the memory circuit. The memory circuit employs multiple pairs of complementary bit lines and is configured so as to present a substantially equivalent electrical load on each bit line of a given pair of bit lines. In this manner, memory latency can be significantly reduced. By utilizing complementary bit lines, differential sensing can be employed so as to significantly improve noise immunity in the memory circuit.

In accordance with one aspect of the invention, a memory circuit includes multiple word lines, multiple pairs of complementary bank bit lines, multiple block select lines, and multiple of block circuits. Each of the block circuits includes a local bit line; a first transistor having a control terminal connected to the local bit line, a first bias terminal connected to a first bank bit line of a given pair of bank bit lines, and a second bias terminal connecting to a first voltage source supplying a first voltage; a second transistor having a control terminal connected to a corresponding one of the block select lines, a first bias terminal connected to a second bank bit line of the given pair of bank bit lines, and a second bias terminal connected to the local bit line; and a plurality of memory cells connected to the local bit line and to respective word lines in the memory circuit. At least two block circuits are connected to a given pair of bank bit lines, the block circuits being configured such that a load on each bank bit line in the given pair of bank bit lines is substantially matched to one another.

In accordance with another aspect of the invention, a sense amplifier circuit for use in a memory circuit including multiple pairs of differential bit lines, includes a read and write port for selectively accessing the sense amplifier circuit in response to a first control signal, and a differential load connected between a first voltage source supplying a first voltage and a given pair of differential bit lines. The differential load is selectively activated in response to a second control signal. The sense amplifier circuit further includes a second stage sense amplifier connected to the given pair of differential bit lines, and a half-state reference generator connected to the given pair of differential bit lines. The half-state reference generator generates a reference current which is selectively pulled from one of the bit lines in the given pair of differential bit lines in response to a third control signal. The sense amplifier circuit is operative in conjunction with a first stage sense amplifier in the memory circuit, the sense amplifier circuit being configured such that activation of the second stage sense amplifier is delayed relative to the first stage sense amplifier.

These and other features and advantages of the present invention will become apparent from the following detailed description of illustrative embodiments thereof, which is to be read in connection with the accompanying drawings.

BRIEF DESCRIPTION OF THE DRAWINGS

FIG. 1 is a schematic diagram depicting at least a portion of an exemplary memory circuit including symmetric bit lines, formed in accordance with one aspect of the present invention.

FIGS. 2B and 2C are graphical illustrations depicting exemplary logic waveforms corresponding to the sense amplifier shown in FIG. 2A, in accordance with the invention.

DETAILED DESCRIPTION OF THE INVENTION

Figure 2A:
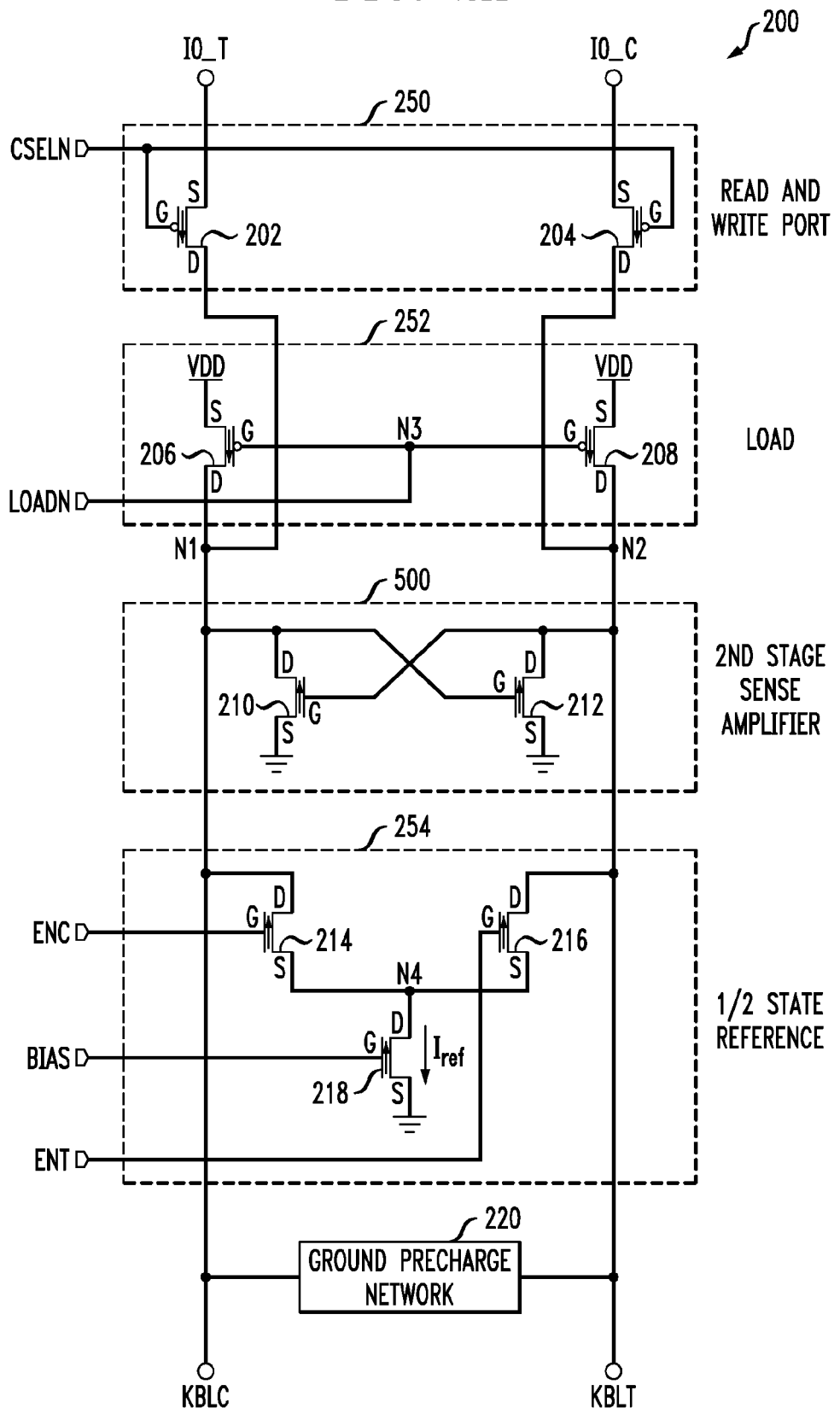
FIG. 2A is a schematic diagram illustrating at least a portion of an exemplary sense amplifier suitable for use in the memory circuit shown in FIG. 1, in accordance with one embodiment of the present invention.

The present invention will be described herein in the context of an illustrative DRAM architecture and illustrative sense amplifiers which may be employed therewith. It should be understood, however, that the present invention is not limited to these or any particular circuit arrangements. Rather, the invention is more generally applicable to techniques for reducing latency and/or leakage noise in a memory circuit. Although implementations of the present invention are described herein with specific reference to n-channel metal-oxide-semiconductor (NMOS) field-effect transistor (FET) devices and p-channel metal-oxide-semiconductor (PMOS) FET devices, as may be formed using a complementary metal-oxide-semiconductor (CMOS) fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

FIG. 1 is a schematic diagram depicting at least a portion of an exemplary memory circuit 100, formed in accordance with one aspect of the present invention. The exemplary memory circuit 100 preferably comprises multiple pairs of symmetric bank bit lines, KBLT_A and KBLC_A, and KBLT_N and KBLC_N, where "T" denotes a true bank bit line and "C" denotes a complement bank bit line of a given pair of bank bit lines. The term "line" as used herein is intended to refer to any substance or medium (e.g., conductor, wire, trace, etc.) that is capable of conveying an electrical signal(s). By employing pairs of symmetric bit lines, the memory circuit 100 provides a differential sensing architecture which beneficially reduces the effects of leakage noise, thereby enhancing noise immunity in the memory circuit. While only two pairs of bank bit lines are shown, the present invention is not limited to any particular number of bank bit lines. Furthermore, although the bank bit lines KBLT_A, KBLC_A, KBLT_N and KBLC_N, are depicted as being oriented in a substantially vertical (e.g., column) dimension, the present invention contemplates that the bank bit lines may be oriented in an alternative direction(s), such as, for example, horizontally, diagonally, etc.

Memory circuit 100 further includes a plurality of memory cells, each of the memory cells comprising an access transistor, 122, 124, 126, 128, 130, 132, 134 and 136, and a corresponding storage capacitor, 122C, 124C, 126C, 128C, 130C, 132C, 134C and 136C, respectively, or alternative storage element. A plurality of word lines, WL_0, WL_15, WL_240 and WL_255, are connected to respective memory cells for selectively accessing the memory cells. Although the word lines are depicted as being oriented in a substantially horizontal (e.g., row) dimension, the present invention contemplates that the word lines may be oriented in an alternative direction(s), such as, for example, vertically, diagonally, etc. Moreover, the orientation of the word lines in relation to the bit lines need not be orthogonal as shown.

As apparent from the figure, the memory cells are preferably organized into a plurality of block circuits, 140, 142, 144 and 146, the block circuits being accessed by control signals supplied by corresponding block select lines, which may be referred to herein as write word lines, WWL_0 and WWL_15. Each block circuit preferably includes a local bit line exclusive to the block circuit, a first transistor, which may be a block write transistor, and a second transistor, which may be a block read transistor. The block write transistor preferably includes a control terminal (e.g., gate) connected to the local bit line, a first bias terminal (e.g., drain) connected to a first bank bit line of a given pair of bank bit lines corresponding to the block circuit, and a second bias terminal (e.g., source) connecting to a first voltage source supplying a first voltage (e.g., ground). The block read transistor preferably includes a control terminal connected to a corresponding one of the block select lines, a first bias terminal connected to a second bank bit line of the given pair of bank bit lines, and a second bias terminal connected to the local bit line.

For example, block circuit 140 preferably includes a block write transistor 110 having a gate (G) connected to write word line WWL_0, a drain (D) connected to true bank bit line KBLT_N, and a source (S) connected to local bit line LBL_N0 and a block read transistor 118 having a gate connected to the local bit line LBL_N0, a drain connected to complement bank bit line KBLC_N, and a source connecting to ground. Block circuit 140 further includes a plurality of one-transistor-one capacitor (1T1C) memory cells, including transistors 130, 132, and corresponding storage capacitors 130C, 132C, connected to local bit line LBL_N0 and to respective word lines WL_0 and WL_15. Specifically, transistor 130 includes a gate connecting to word line WL_0, a drain connected to local bit line LBL_N0, and a source connected to a first terminal of capacitor 130C. A second terminal of capacitor 130C connects to ground. Likewise, transistor 132 includes a gate connecting to word line WL_15, a drain connected to local bit line LBL_N0, and a source connected to a first terminal of capacitor 132C. A second terminal of capacitor 132C connects to ground. While block circuit 140 is shown as including two memory cells, it is to be understood that a given block circuit is not limited to any particular number of memory cells.

It is to be appreciated that, because a metal-oxide-semiconductor (IOS) device is symmetrical in nature, and thus bidirectional, the assignment of source and drain designations in the MOS device is essentially arbitrary. Therefore, the source and drain may be referred to herein generally as first and second source/drains, respectively, where the term "source/drain" in this context denotes a source or a drain of the MOS device.

Block circuits 142, 144, 146 are preferably configured in a manner similar to block circuit 140. Specifically, block circuit 142 comprises a first transistor 106 having a gate connected to write word line WWL_0, a drain connected to bank bit line KBLT_A and a source connected to local bit line LBL_A0, and a second transistor 114 having a gate connected to local bit line LBL_A0, a drain connected to bank bit line KBLC_A, and a source connecting to ground. Block circuit 142 further includes memory cells, comprising transistors 122, 124 and corresponding storage capacitors 122C, 124C, connected to local bit line LBL_A0. Like block circuit 140, word lines WL_0 and WL15 are used to access the memory cells in block circuit 142. Block circuit 144 comprises a first transistor 112 having a gate connected to write word line WWL_15, a drain connected to bank bit line KBLC_N and a source connected to local bit line LBL_N16, and a second transistor 120 having a gate connected to local bit line LBL_N16, a drain connected to bank bit line KBLT_N, and a source connecting to ground. Block circuit 144 further includes memory cells, comprising transistors 134, 136 and corresponding capacitors 134C, 136C, connected to local bit line LBL_N6. The memory cells in block circuit 144 are preferably accessed via corresponding word lines WL_240 and WL_255. Block circuit 146 comprises a first transistor 108 having a gate connected to write word line WWL_15, a drain connected to bank bit line KBLC_A and a source connected to local bit line LBL_A16, and a second transistor 116 having a gate connected to local bit line LBL_A16, a drain connected to bank bit line KBLT_A, and a source connecting to ground. Block circuit 146 further includes memory cells, comprising transistors 126, 128 and corresponding storage capacitors 126C, 128C, connected to local bit line LBL_A16. Like block circuit 144, word lines WL_240 and WL_255 are used to access the memory cells in block circuit 146.

As previously described, each block circuit preferably includes a local bit line which is exclusive to the block circuit. Additionally, the block write transistor, which functions primarily as a write port for the block circuit, and block read transistor, which functions as a read port for the block circuit, helps isolate the local bit line from the corresponding pair of bank bit lines. In this manner, the load appearing on a pair of bank bit lines at any given time is significantly reduced, thereby improving latency in the memory circuit 100.

For a given pair of bank bit lines (e.g., KBLT_N, KBLC_N), a difference in the electrical loads (e.g., capacitive load and resistive load) appearing on the bank bit lines is primarily attributable to the block write transistors and the block read transistors connected thereto. For instance, the load present on true bank bit line KBLT_N is primarily due to transistors 110 and 120 in block circuits 140 and 144, respectively.

Likewise, the load present on complement bank bit line KBLC_N is primarily due to transistors 118 and 112. In a differential sensing architecture, it is beneficial if the electrical loads on the two bank bit lines of a given pair of bank bit lines are substantially matched to one another. However, since the write current passing through the block write transistor in a given block circuit is typically different compared to the sense (read) current passing through the block read transistor, the sizes of the block write transistor and block read transistor are different. Consequently, the respective loads attributable to the block write transistor and block read transistor will be different.

In accordance with one aspect of the present invention, the block circuit circuits (e.g., 140, 144) connected to each pair of bank bit lines (e.g., KBLT_N, KBLC_N) in the memory circuit 100 are preferably configured so as to present a substantially equivalent electrical load on each bank bit line of a given pair of bank bit lines. In furtherance of this objective, a substantially equal number of block write transistors and block read transistors are preferably connected to each of the bank bit lines of the given pair of bank bit lines. For example, in the illustrative case in which there are only two block circuits 140, 144 connected to a pair of bank bit lines KBLT_N and KBLC_N, the block write transistor 110 in block circuit 140 is connected to true bank bit line KBLT_N and the block read transistor 118 is connected to complement bank bit line BLC_N, while the block write transistor 112 in block circuit 144 is connected to complement bank bit line KBLC_N and the block read transistor 120 is connected to true bank bit line KBLT_N. Both bank bit lines KBLT_N and KBLC_N will therefore have an equal number of block write transistors and block read transistors connected thereto, thereby presenting substantially equivalent electrical loads to the bank bit lines.

Where there is an odd number of block circuits coupled to a given pair of bank bit lines, the number of block write transistors and block read transistors connected to each bank bit line of the given pair of bank bit lines will, inherently, not be the same. Optionally, a dummy load circuit 156 can be connected to the pair of bank bit lines in order to provide more precise load matching between the two bank bit lines. Where the number of block circuits connected to a given pair of bank bit lines is substantially large (e.g., greater than about one hundred), the mismatch in load between the two bank bit lines may be so minimal that the additional semiconductor area consumed by the dummy load circuit 156 would essentially negate any benefits obtained by more closely matching the loads on the two bank bit lines.

At least one given block circuit connected to a corresponding pair of bank bit lines may further comprise a pre-charge circuit (not shown) coupled to a local bit line in the given block circuit for setting the local bit line to a known voltage level. By setting the local bit lines to a known voltage level, the speed of the read operation in the memory circuit 100 can be advantageously increased. The pre-charge circuit may include an NMOS transistor device, or alternative device, having a first bias terminal connected to the local bit line, a second bias terminal connecting to a voltage source providing the known voltage level, such as, for example, ground, and a control terminal connecting to a corresponding control signal, to insure that the local bit line is pre-charged to the known voltage level. Alternatively, the pre-charge circuit can be implemented using existing components in the block circuit. For example, in block circuit 140, the local bit line LBL_N0 may be pre-charged to ground through the block write transistor 110 and a grounded (e.g., during a pre-charge mode of operation) bank bit line KBLT_N, thereby eliminating the necessity for additional pre-charge circuitry.

Each pair of bank bit lines, KBLT_A, KBLC_A and KBLT_N, KBLC_N, is preferably connected to a corresponding column read/write circuit 102 and 104, respectively, for selectively reading or writing a logical state of one or more memory cells in the memory circuit 100. Each of the column read/write circuits 102, 104 preferably comprises a read circuit, including one or more sense amplifiers (not shown) and/or related circuitry for reading the logical state of a memory cell in the corresponding pair of bank bit lines, and a write circuit, including a write current generator (not shown) and/or related circuitry for writing the logical state of one or more memory cells in corresponding pair of bank bit lines. In a DRAM application, the column read/write circuits 102, 104 are preferably operative to write back the data read from the memory cell, since the read operation is generally destructive.

The column read/write circuits 102, 104 are preferably connected to a bidirectional input/output (I/O) circuit 150 via a pair of differential I/O lines 152 and 154. I/O lines 152, 154 preferably convey selected bank bit line signals, which are logical complements of one another. The bidirectional I/O circuit 150, which may comprise a multiplexer or an alternative switching arrangement, provides selective access to the memory circuit 100 for reading or writing data to the memory cells. Prior to a read or write operation, bidirectional I/O circuit 150 may be operative to pre-charge the differential I/O lines 152, 154 to a known voltage level, such as, for example, ground (zero volt).

During a write operation, the block write transistor (e.g., 110) in a given block circuit (e.g., 140) serves as a write port for the block circuit. When enabled by an appropriate control signal (e.g., logic high) on a corresponding write word line (e.g., WWL_0), the block write transistor electrically connects the local bit line (e.g., LBL_N0) to the corresponding bank bit line (e.g., KBLT_N). By way of example only, to write one or more memory cells (e.g., 130/130C, 132/132C) in block circuit 140 to a new logic state, the corresponding column read/write circuit 104 preferably drives a high or low signal, indicative of a high or low logic state, respectively, through bank bit line KBLT_N0, block write transistor 110, local bit line LBL_N0, and into one or more selected memory cells connected to the local bit line LBL_N0. A given one of the memory cells in block circuit 140 may be selected by applying an appropriate control signal (e.g., logic high) to a corresponding word line, WL_0, WL_15. Thus, to write the memory cell comprising transistor 130 and storage capacitor 130C, a high signal (e.g., VDD) is applied to word line WL_0 thereby turning on transistor 130 and electrically connecting capacitor 130C to the local bit line LBL_N0 for storing the new logic state.

During a read operation, the block read transistor (e.g., 118) in a given block circuit (e.g., 140) serves as a read port for the block circuit. When enabled, the block read transistor pulls the bank bit line to which it is connected to ground, or an alternative voltage source. The block read transistor in a given block circuit may be enabled in one of at least three ways, namely, (i) when reading a logic "1" from one of the plurality of memory cells in the block circuit, (ii) when writing a logic "1" into one or more of the memory cells, and (iii) when writing-back a logic "1" into one or more of the memory cells. By way of example only, when reading one of the memory cells (e.g., 130/130C) corresponding to block circuit 140, the storage capacitor 130C of the memory cell shares charge with the local bit line LBL_N0, to which access transistor 130 is connected, after the voltage on corresponding word line WL_0 rises to a logic high level (e.g., VDD). The final voltage on the local bit line LBL_N0 will depend on the charge stored in the storage capacitor 130C, the relative capacitance of the storage capacitor, and on the total capacitance of the local bit line LBL_N0, including terminals of the devices connected thereto. The charge on the storage capacitor 130C represents the logic state of the corresponding memory cell. Thus, a storage capacitor with little or no voltage across it may represent a logic "0" state. Likewise, a capacitor that is charged to a voltage above a threshold voltage of the block read transistor 118 (e.g., greater than about 0.7 volt) may represent a logic "1" state, since the stored charge is high enough to enable the block read transistor.

Assuming that the local bit line LBL_N0 is pre-charged to ground, once the memory cell is selected, such as by turning on the access transistor 130 corresponding thereto, the memory cell holding a logic "0" does not substantially change the voltage on the local bit line. Hence, the block read transistor 118 remains turned off and conducts no significant current. In contrast, the memory cell holding a logic "1," once selected, drives the local bit line LBL_N0 above the threshold voltage of block read transistor 118. Hence, block read transistor 118 turns on and conducts current. The sense amplifier in the corresponding column read/write circuit 104 is preferably operative to detect the presence or absence of a current flowing through complementary bank bit line KBLC_N, to thereby determine whether the selected memory cell 130/130C holds a logic "1" or logic "0," respectively.

The block read transistor in each block circuit connects to either the true or complement bank bit line of the given pair of bank bit lines corresponding to the block circuit. For example, in block circuit 140, the block read transistor 118 connects to the complement bank bit line KBLC_N, while in block circuit 144, the block read transistor 120 connects to the true bank bit line KBLT_N. Additionally, block read and write transistors are preferably connected in substantially equivalent numbers to the true and complement bank bit lines. Each of the pairs of bank bit lines in exemplary memory circuit 100 may therefore be said to be symmetric. In this manner, a signal traversing either a true or complement bank bit line sees essentially the same parasitic capacitance, irrespective of the electrical path traversed. Thus, in one instance, the true bank bit line (e.g., KBLT_N) of a given pair of bank bit lines will serve as a write bus for writing a datum into a given block circuit (e.g., 140), and the corresponding complement bank bit line (e.g., KBLC_N) will serve as a read bus for retrieving a datum from that block circuit, while in another instance, the complement bank bit line will serve as a write bus for writing a datum into another block circuit (e.g., 144), and the true bank bit line will serve as a read bus for retrieving a datum from that other block circuit.

The block read transistor in each block circuit essentially serves as a transconductance amplifier, transforming a voltage on a corresponding local bit line into a read current that is then transferred, through one of the bank bit lines, to a corresponding column read/write circuit. In the memory circuit 100, it is current, rather than charge, that serves as the medium for transferring signals from the block circuits to the respective column read/write circuits.

Figure 3A:
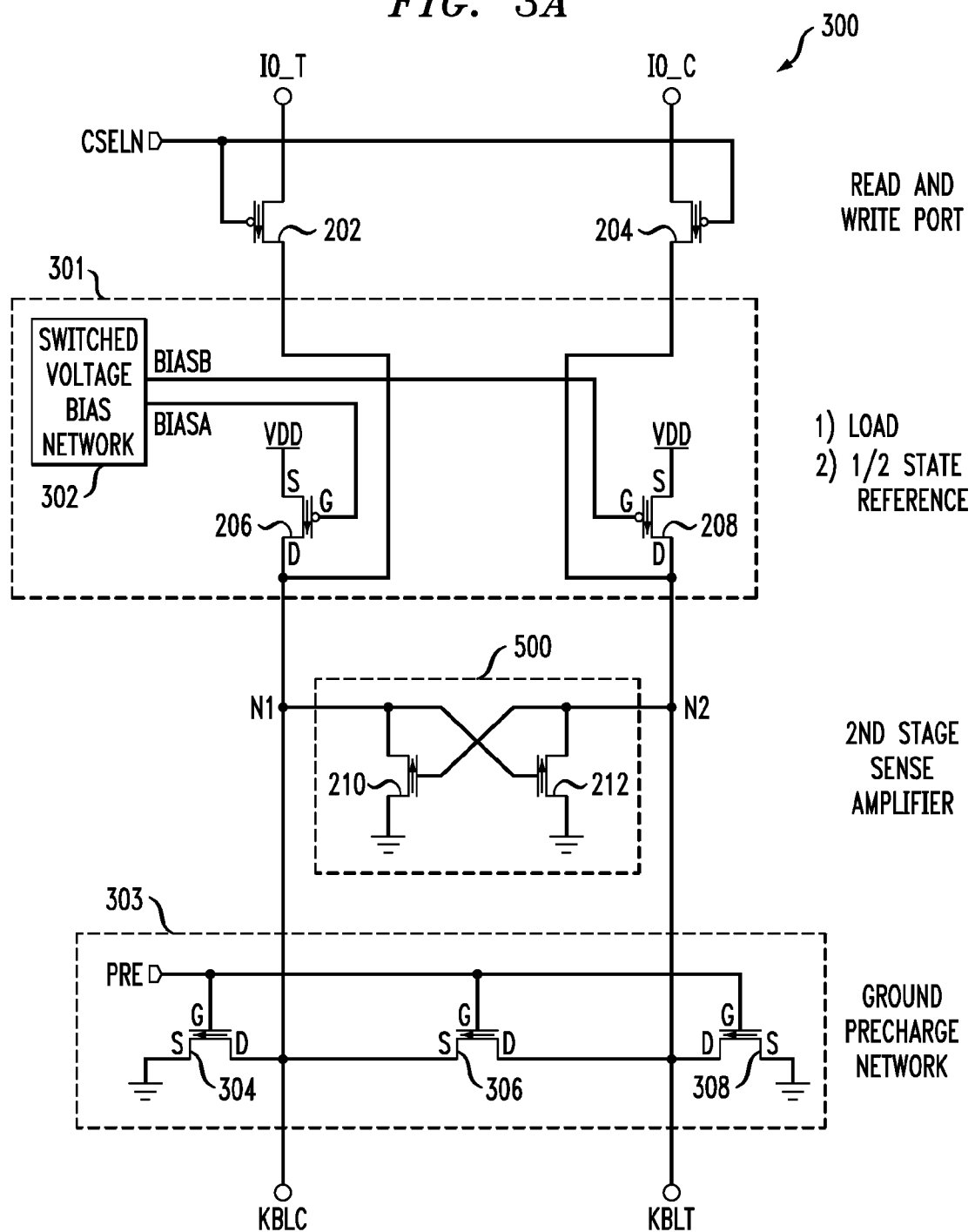
FIG. 3A is a schematic diagram illustrating at least a portion of an exemplary sense amplifier suitable for use in the memory circuit shown in FIG. 1, in accordance with a second embodiment of the present invention.
Figure 4A:
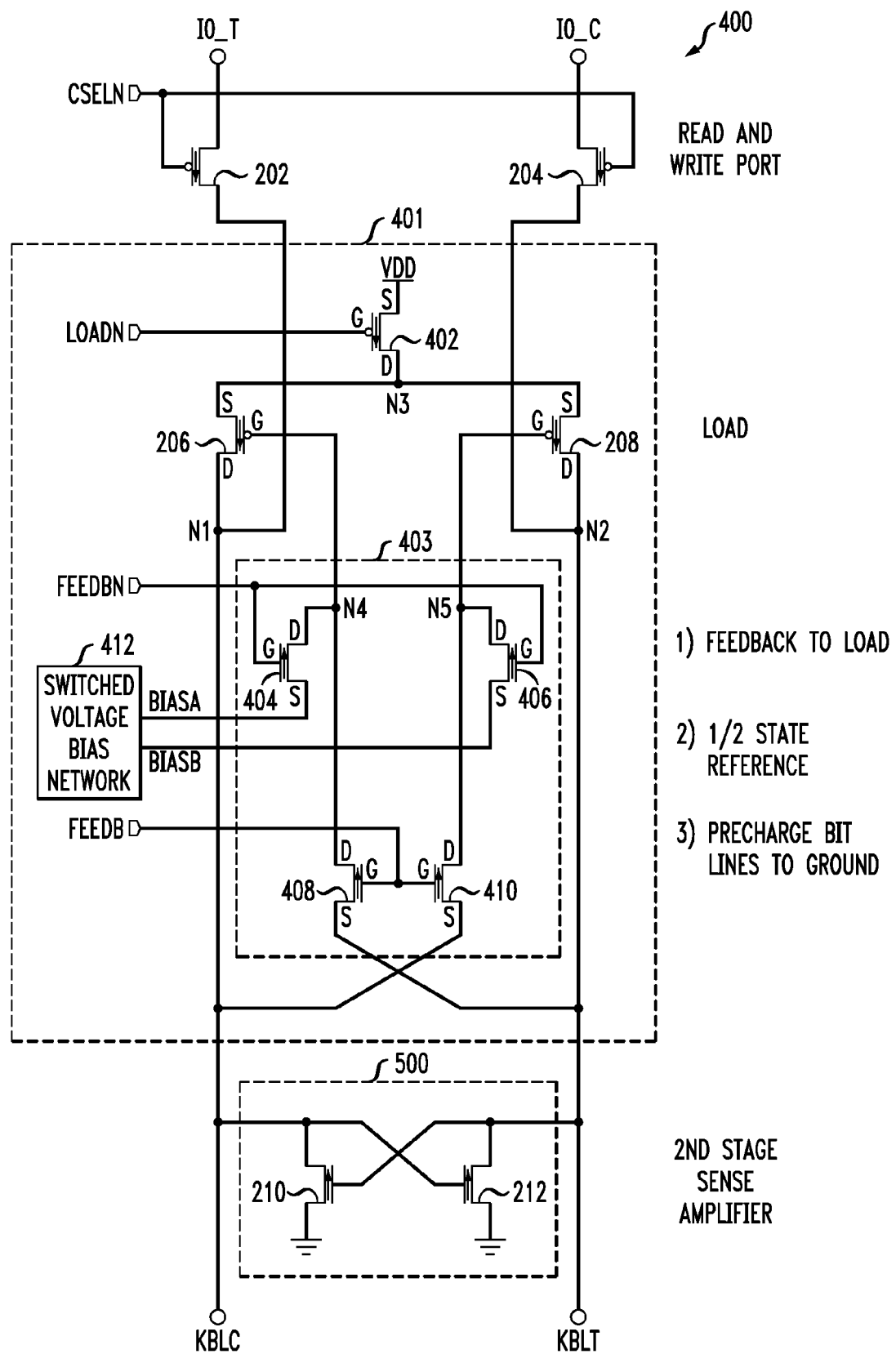
FIG. 4A is a schematic diagram illustrating at least a portion of an exemplary sense amplifier suitable for use in the memory circuit shown in FIG. 1, in accordance with a third embodiment of the present invention.

As previously explained, sense amplifiers included in the column read/write circuits 102, 104, are preferably employed to detect the logic states of selected memory cells in the memory circuit 100. FIGS. 2A, 3A and 4A depict sense amplifier circuits, formed in accordance with various illustrative embodiments of the invention, which are suitable for use in the exemplary memory circuit 100 of FIG. 1. It is to be understood that the present invention is not limited to the particular sense amplifier circuits shown. The sense amplifiers, in combination with the memory circuit 100 of FIG. 1, form a differential and hierarchical bit line sensing scheme for detecting the logical state of one or more memory cells in the memory circuit.

FIG. 2A is a schematic diagram illustrating an exemplary sense amplifier circuit 200, formed in accordance with one embodiment of the present invention. Sense amplifier circuit 200 preferably includes a read and write port 250, a load 252, a half-state reference generator 254, a second stage sense amplifier 500, and a ground pre-charge circuit 220. As previously stated, the present invention is not limited to the particular sense amplifier circuit arrangement shown.

The read and write port 250 in sense amplifier circuit 200 selectively connects the pair of bank bit lines, KBLT and KBLC, to a bidirectional I/O circuit (e.g., bidirectional I/O circuit 150 shown in FIG. 1), or an alternative circuit external to the sense amplifier, in response to at least one control signal, CSELN, presented to the read and write port. The read and write port 250 preferably includes a first PMOS transistor device 202 and a second PMOS transistor device 204. A source (S) of transistor device 202 preferably connects to a first I/O line, IO_T, which may be a true I/O line, a drain (D) of device 202 is connected to the load 252 at node N1, and a gate (G) of device 202 receives the control signal CSELN. A source of transistor device 204 preferably connects to a second I/O line, IO_C, which may be a complement I/O line, a drain of device 204 is connected to the load 252 at node N2, and a gate of device 204 receives the control signal CSELN. The I/O lines, collectively, form a differential input/output of the sense amplifier circuit 200, since access to the sense amplifier circuit via the I/O lines IO_T and IO_C is preferably bidirectional.

When the control signal CSELN is a logic high level, transistor device 202 and 204 are turned off, thereby disconnecting bank bit lines KBLC and KBLT from I/O lines IO_C and IO_T, respectively, and allowing nodes N1 and N2 to float. Load 252, which functions primarily to set nodes N1 and N2 to a known voltage level (e.g., VDD), presents a resistance to VDD that transforms respective currents passing through the true and complement bank bit lines KBLT, KBLC, into a measurable voltage difference across the bank bit lines. During a read operation, the block read transistor (e.g., 118) in a selected block circuit (e.g., 140) in the memory circuit of FIG. 1, in conjunction with the load 252, essentially serves as a first stage sense amplifier, providing current gain for a fixed amount of charge stored in a selected memory cell to be read.

Load 252 preferably comprises a first PMOS transistor device 206 having a source connecting to VDD, or an alternative voltage source, a drain connected to node N1, and a gate for receiving a control signal, LOADN, at node N3. Load 252 further comprises a second PMOS transistor device 208 having a source connecting to VDD, a drain connected to node N2, and a gate connected to the gate of transistor device 206 at node N3. While resistors can be substituted for the PMOS transistor devices 206, 208 in the load 252, a benefit to using transistor devices is that they can be selectively turned on and off to reduce power consumption. Specifically, control signal LOADN is used to selectively activate the load 252, such that when LOADN is, for instance, a logic low level (e.g., ground), transistor devices 206 and 208 are turned on, thereby pulling up nodes N1 and N2 substantially to VDD, When read and write port 250 is enabled, such as by applying a logic low CSELN signal, the load 252 is preferably enabled so as to transfer the logic state stored in a selected memory cell to and from the sense amplifier circuit 200 during its active operation (e.g., read, write, or write-back operation).

The half-state reference generator 254 in sense amplifier circuit 200 functions 5 primarily to generate a reference current, Iref, which is selectively pulled from either the true bank bit line, KBLT, or the complement bank bit, KBLC, in response to at least one control signal supplied to the half-state reference generator. Half-state reference generator 254 preferably comprises a first NMOS transistor device 214 including a drain connecting to the complement bank bit line KBLC at node N1, and a gate for receiving a 10 first control signal, ENC. The half-state reference generator 254 further comprises a second NMOS transistor device 216 including a drain connecting to the true bank bit line KBLT at node N2, a gate for receiving a second control signal, ENT, and a source connected to a source of transistor device 214 at node N4.

A substantially constant current source for supplying the reference current Iref is preferably connected between node N4 and a second voltage source supplying a second voltage, which may be ground. The current source may comprise, for example, a third NMOS transistor device 218 including a drain connected to node N4, a source connecting to ground, and a gate for receiving a third control signal, BIAS. A magnitude of the reference current can be selectively controlled as a function of control signal BIAS. The half-state reference generator 254 is preferably configured such that the reference current Iref is pulled from the bank bit line that is opposite to the bank bit line to which an active block read transistor in a corresponding block circuit to be read is connected.

By way of example only, assume block circuit 140 in the memory circuit 100 of FIG. 1 is enabled during a given read cycle. Since the block read transistor 118 in block circuit 140 is connected to complement bank bit line KBLC_N, the NMOS transistor device 218 in half-state reference generator 254 would draw the reference current Iref from true bank bit line KBLT_N via transistor device 216. This can be accomplished by maintaining control signal ENC at a logic low state, thereby keeping transistor device 214 turned off, and driving control signal ENT to a logic high state, thereby turning on transistor device 216. For block circuit 144, half-state reference generator 254 would be configured in an opposite manner, with transistor device 214 turned on and transistor device 216 turned off, since the block read transistor 120 is connected to the true bank bit line KBLT_N. It is to be appreciated that alternative current steering and/or switching arrangements are similarly contemplated by the invention, as will become apparent to those skilled in the art.

As previously stated, the block read transistor in a given block circuit, in combination with the load 252, functions as a first stage sense amplifier, in essence a preamplifier, for generating a voltage difference between the true and complement bank bit lines. The second stage sense amplifier 500, which preferably includes a pair of cross-coupled NMOS transistor devices 210 and 212, serves as a latch for further amplifying the voltage difference between the true and complement bank bit lines. Specifically, a source of transistor device 210 connects to ground, a drain of device 210 is connected to a gate of transistor device 212 at node N1, a gate of device 210 is connected to a drain of device 212 at node N2, and a source of device 212 connects to ground. The present invention, however, is not limited to the particular circuit arrangement shown.

The activation of the first and second stage sense amplifiers is preferably staggered in time (e.g., delayed) relative to one another. Since the second stage sense amplifier 500 introduces positive feedback onto the pair of bank bit lines KBLC, KBLT, which may otherwise adversely affect the development of the voltage difference between the bank bit lines, activation of the second stage sense amplifier is preferably delayed until after the first stage sense amplifier has had ample time to develop a robust signal that can adequately bias the second stage sense amplifier. The delay may be controlled, at least in part, by adjusting respective threshold voltages of transistors 210 and 212. By increasing the threshold voltages of these devices 210, 212, the delay between activation of the first stage sense amplifier and activation of the second stage sense amplifier 500 is increased.

In order to achieve robust operation of the sense amplifier circuit 200, the PMOS devices 206, 208 in load 252 are preferably sized so that the voltage on each of the bank bit lines ramps up slowly enough to permit a significantly large voltage difference (e.g., greater than about 0.5 volt) to be developed between the true and complement bank bit lines before the voltage on any one of the bank bit line rises substantially above a threshold voltage level of the cross-coupled NMOS devices 210, 212 in the second stage sense amplifier 500. The reason for this preferred operational constraint is that once the voltage level on one of the bank bit lines rises above the threshold voltage of the NMOS devices 210, 212, positive feedback will be generated which accelerates the development of the voltage difference, at the expense of noise immunity. Hence, the cross-coupled NTOS devices 210, 212 should only be operational as a second stage sense amplifier, to latch the voltage difference between the bank bit lines after the voltage difference has fully developed. This will reduce bit errors in the read operation.

The ground pre-charge circuit 220 in the exemplary sense amplifier circuit 200 serves to set the pair of bank bit lines KBLC and KBLT to a known voltage level, preferably ground, prior to a read or write access. Ground pre-charge circuit 220 may be selectively enabled or disabled in response to one or more control signals presented thereto. Although shown as a separate circuit, it is to be appreciated that the ground pre-charge circuit 220 can be implemented using already existing components in the sense amplifier circuit 200. The illustrative memory circuit 100 depicted in FIG. 1 places no restrictions on the initial voltage to which the bank bit lines are set. However, setting the bank bit lines initially to ground advantageously reduces subthreshold leakage current in the memory circuit substantially to zero, and is therefore preferred.

By way of example only, prior to a read or write access, control signals LOADN and CSELN are driven to a logic high level, thereby turning off PMOS devices 206, 208, 202 and 204, and control signals ENC and ENT are driven to a logic low level, thereby turning off NMOS devices 214 and 216. Ground pre-charge circuit 220 is preferably enabled to ground the bank bit lines KBLC, KBLT. Upon a read or write access, ground pre-charge circuit 220 is disabled and control signal LOADN is driven to a logic low level, thereby turning on PMOS transistor devices 206, 208 in the load 252. By turning on devices 206, 208, the bank bit lines KBLC, KBLT will be gradually pulled up to VDD at a substantially equivalent rate. Concurrently, one of the control signals ENC or ENT is driven to a logic high level, thereby turning on either NMOS device 214 or 216, respectively, in the half-state reference generator 254. The selection of which NMOS device to turn on will depend on which bank bit line (e.g., true or complement) the block read transistor in the selected block circuit is connected to.

The reference current Iref, generated by the half-state reference generator 254, and the read current, generated on the corresponding local bit line by a selected memory cell, will pull the bank bit lines down, thereby generating either a negative or positive voltage difference between the true and complement bank bit lines. The voltage difference between the two bank bit lines is indicative of the datum stored in the selected memory cell. Once one bank bit line is driven close to ground and the other bank bit line is driven close to VDD, the datum that is detected is preferably written back to the memory cell to restore the total charge in the memory cell to an acceptable level for the next read or write access. Recall that, in an illustrative DRAM application, charge sharing between a selected memory cell and a corresponding local bit line depletes the selected memory cell of its charge. This is often referred to as a destructive read operation. Thus, charge needs to be restored to the selected memory cell, such as in a write-back operation.

Unlike traditional DRAM architectures wherein the sensing operation restores the charge to a selected memory cell, the hierarchical bit line memory architecture of the present invention requires that one write word line, WWL_0 or WWL_15, enable corresponding block write transistors 106, 110 or 116, 120, respectively, to restore the charge to the selected memory cell. For a selected memory cell, such as, for example, memory cell 130, 130C, such charge can be driven from a given one of the column read/write circuits (e.g., 104), through bank bit line KBLT_N through block write transistor 110, through local bit line LBL_N0, and into the storage capacitor 130C via access transistor 130 in the selected memory cell.

FIG. 2B is an illustrative logic timing diagram 260 depicting an exemplary operation of the sense amplifier circuit 200 shown in FIG. 2A. The timing diagram 260 illustrates three distinct phases of operation of the sense amplifier circuit, namely, a pre-charge operation, a read operation, and a write-back operation, in accordance with the present invention. In particular, the timing diagram 260 illustrates how control signals LOADN, ENC and ENT work in conjunction with a selected word line, WL, and a selected write word line, WW, to read a datum from a selected memory cell and to write the datum back to the selected memory cell. It should be noted that the same sequence of signals used during a read operation should also be applied during a write operation, since for dense DRAM architectures, only one pair of bank bit lines from a plurality of such pairs is written by a bidirectional I/O circuit during a given memory cycle. The memory cells connected to unselected pairs of bank bit lines must still be read and then restored, such as by a write-back operation, since their collective word line is enabled.

With reference to FIGS. 2A and 2B, true and complement bank bit lines KBLT and KBLC, respectively, are preferably initially grounded (logic low) prior to a memory access through ground pre-charge circuit 220. The read operation is preferably initiated by the word line WL being driven to a logic high level. A falling LOADN signal enables the pull-up action of the load 252, and thereby the bank bit lines KBLT and KBLC begin to rise toward VDD at a substantially equal rate. Concurrently, the reference current Iref, generated by the half-state reference generator 254, and the read current pull one of the bank bit lines down, thereby generating a negative or positive voltage difference between the bank bit lines. Either the enable complement control signals ENC or the enable true signal ENT steers the reference current to the complement or true bank bit line KBLC or KBLT, respectively. The choice of which bank bit line to steer the reference current through will depend upon which block read transistor has been enabled, as previously explained.

Although not shown in the exemplary logic diagram 260, driving the column select control signal CSELN to a logic low level connects the true and complement bank bit lines KBLT, KBLC, to a bidirectional I/O circuit 154 (see FIG. 1). As shown in FIG. 1, a plurality of column select signals, CSELN_A and CSELN_N, preferably control a multiplexer comprising the read and write ports of the sense amplifier circuits in the column read/write circuits 102, 104. In this manner, signals CSELN_A and CSELN_N select which one of the column read/write circuits 102, 104 will be connected to the bidirectional I/O circuit 154.

The difference between a read operation and a write operation is evident by observing the transient voltages of the local bit line LBL and the true and complement bank bit lines KBLT, KBLC. FIG. 2C is an illustrative logic timing diagram 280 depicting an exemplary operation of the sense amplifier circuit 200 shown in FIG. 2A. Timing diagram 280, like timing diagram 260, depicts three distinct phases of operation of the sense amplifier circuit 200, namely, a pre-charge operation, a write operation, and a write-back operation. In this example, the memory cell is written from a one state to a zero state. An exemplary waveform depicting the voltage of a corresponding memory cell, as measured across a storage capacitor (CAP) of the cell, is shown. The pre-charge operation is essentially the same as described in conjunction with FIG. 2B. The write operation predisposes the bank bit lines to the desired zero state to be written. Driving a corresponding write word line WWL to a high logic level enables writing the zero state stored on the bank bit lines into the memory cell, as shown in the write-back phase. During the write operation, one of the bank bit lines KBLC, KBLT is pulled to a logic high level through a corresponding one of the PMOS devices 202, 204 in the read and write port 250.

The write operation should be sufficiently strong so as to be able to overwrite a stored datum having an opposite logic state to the datum being read. Thus, the PMOS devices 202, 204 are preferably sized to supply enough current to overwhelm a positive or negative voltage difference established between the bank bit lines during a read operation. If a selected memory cell stores a logic "1," the block read transistor corresponding to the selected memory cell attempts to drive a read datum by pulling down one of the bank bit lines KBLC and KBLT, while one of the PMOS devices 202, 204 pulls up the same bank bit line, either KBLC or KBLT. Only after the corresponding write word line is enabled can the new datum change the voltage on the local bit line from a logic high to a logic low, hence disabling the block read transistor, and thereby write the state of the memory cell to a logic "0."

It is advantageous to use a low threshold transistor for the block read transistor because the noise margin for sensing a logic "1" in a memory cell through the block read transistor is substantially improved. This is especially true given that writing a logic "1" into a memory cell takes a substantial amount of time because the NMOS access transistor in the memory cell is operated as a source follower, and hence, high signal margin of the memory cell is traded off with memory cycle time.

Generally, a differential sensing approach offers significantly greater immunity to power supply bounce, as well as other noise sources, when compared to a single-ended sensing approach. Additional benefits of the hierarchical bit line sensing methodology of the present invention include, but are not limited to, mitigation of leakage noise attributable to unselected block read and block write transistors during a read or write operation.

Differential sensing reduces the noise due to leakage currents in the memory circuit. Unselected block read transistors contribute most significantly to leakage noise, primarily because it is advantageous to implement the block read transistors using low threshold transistors in order to improve noise margin, as stated above. If the leakage sources connected to both bank bit lines were identical in magnitude and the loads (e.g., within the sense amplifier, load PMOS devices 206, 208) were equivalent, the leakage current would have no impact on the net positive or negative differential voltage, since the leakage currents would cancel one another Unfortunately, this is not entirely the case in practice.

Due to intrinsic differences in threshold voltages among the plurality of block read transistors corresponding to a given pair of bank bit lines, a statistical treatment which takes into account threshold variation, as well as other device variations (e.g., temperature, voltage, etc.), can be applied to determine the actual net cancellation of leakage noise. However, it is easy to conclude that the leakage noise will, at a minimum, be reduced by at least half for a differential bit line architecture compared to a single-ended architecture, since about half the number of block read transistors are connected to any given bank bit line of the pair of bank bit lines.

The differential bit line sensing methodology of the present invention also beneficially reduces power consumption in the memory circuit, particularly during a standby mode of operation. During standby, the bank bit lines are preferably pre-charged to ground, and therefore the block read transistors consume substantially no power because the gate, source, and drain of each block read transistor are at the same potential.

FIG. 3A is a schematic diagram illustrating at least a portion of an exemplary sense amplifier circuit 300, formed in accordance with a second embodiment of the present invention. As apparent from the figure, the sense amplifier circuit 300 is essentially the same as sense amplifier circuit 200 described above in conjunction with FIG. 2A, except that the load 252 in sense amplifier circuit 200 has been modified in sense amplifier circuit 300 to incorporate the functions of the half-state reference generator 254. Specifically, sense amplifier circuit 300 includes a load 301 comprising PMOS transistors 206 and 208, and a switched voltage bias network 302. PMOS transistor 206 includes a source connecting to a first voltage source supplying a first voltage, preferably VDD, a gate for receiving a first bias signal, BIASA, and a drain connected to a complement bank bit line, KBLC, at node N1. PMOS transistor 208 includes a source connecting to VDD, a gate for receiving a second bias signal, BIASB, and a drain connected to a true bank bit line, KBLT, at node N2. As in the case of sense amplifier circuit 200 (see FIG. 2A), the PMOS transistor devices 206, 208 serve as a pull-up load for the first stage sense amplifier, which comprises a block read transistor of a corresponding block circuit.

The switched voltage bias network 302 is preferably operative to generate the bias signals BIASA, BJASB, for controlling a magnitude of current flowing through transistors 206, 208, respectively. When the bias signals BIASA, BIASB are at VDD, for example, during a pre-charge operation of the sense amplifier circuit 300, transistors 206, 208 will be turned off. The switched voltage bias network 302 regulates the gate voltages of PMOS load devices 206, 208 for pre-charge, read, and write-back operations (see FIG. 3B).

Incorporating the half-state reference generator into the load 301 has the benefit of reducing the total transistor count of the sense amplifier circuit 300, and additionally has the more subtle benefit of reducing mismatch characteristics of the half-state reference generator The threshold voltage mismatch between two MOS transistors is approximately proportional to an inverse of the square root of their respective gate areas. Thus, using large sizes, typically defined as a ratio of channel width to channel length of a given MOS device, for PMOS transistors 206, 208, advantageously reduces the threshold mismatch (e.g., resulting from differences in a total number of dopants) between the transistors. Moreover, switched voltage bias network 302 may be configured such that PMOS transistors 206, 208 are operated with significantly higher gate-to-source voltage compared to alternative sense amplifier arrangements, thereby further minimizing the impact of threshold voltage on source-drain current in the devices.

Like sense amplifier circuit 200 shown in FIG. 2A, sense amplifier circuit 300 further comprises a ground pre-charge circuit 303. The ground pre-charge circuit 303 preferably includes first, second and third NMOS transistor devices 304, 306 and 308. A source of device 304 preferably connected to ground, a drain of device 304 is connected to complement bank bit line KBLC at node N1, and a gate of device 304 receives control signal PRE. A drain of device 306 is preferably connected to true bank bit line KBLT at node N2, a source of device 306 is connected to complement bank bit line KBLC at node N1, and a gate of device 306 is connected to the gate of device 304. A drain of device 308 is connected to true bank bit line KBLT at node N2, a source of device 308 connects to ground, and a gate of device 308 is connected to the gate of device 304. Signals BIASA, BIASB and PRE, predominantly control the operation of the sense amplifier circuit 300. It is to be understood that the present invention is not limited to the particular ground pre-charge circuit arrangement shown.

Figure 3B:
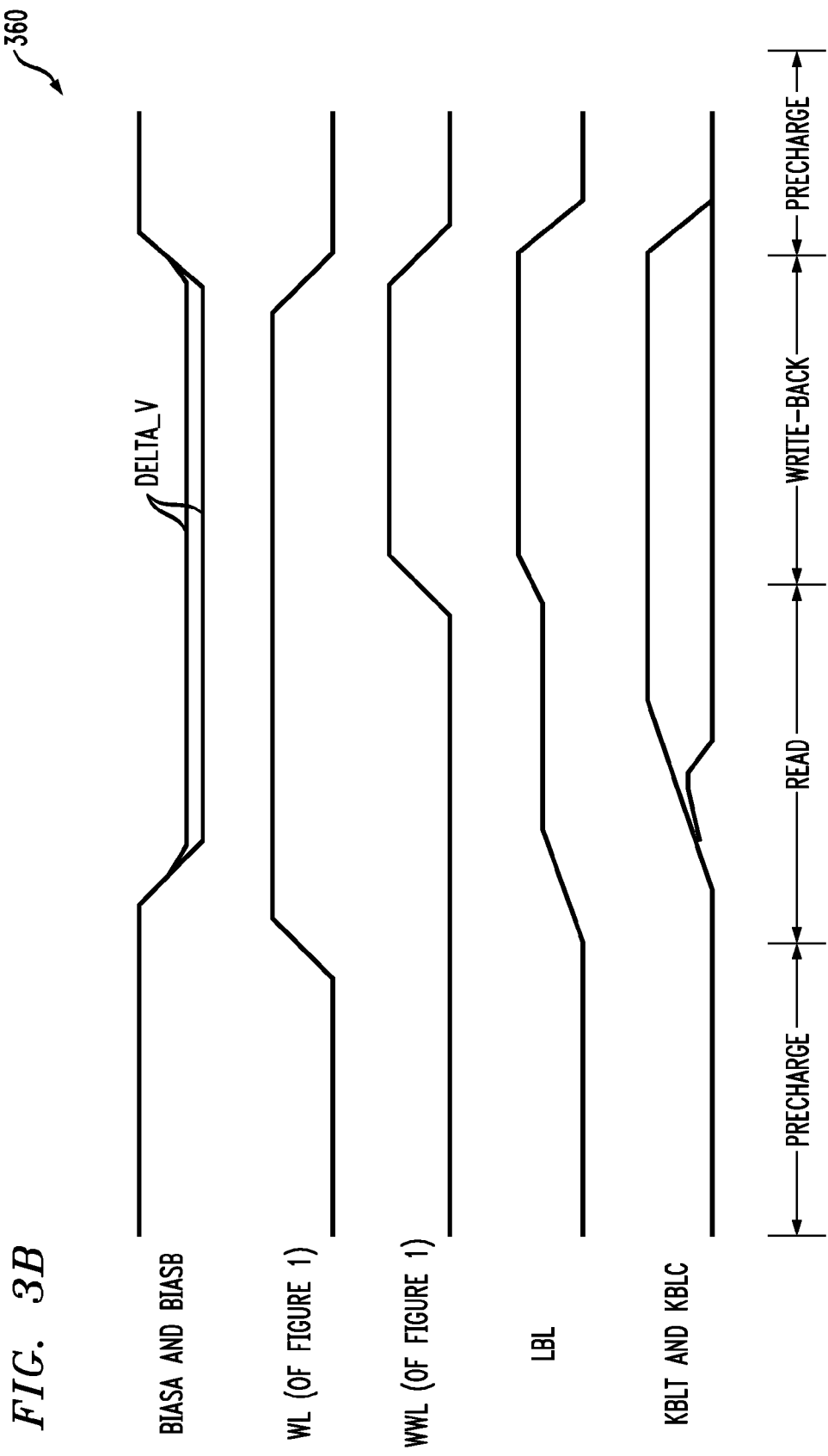
FIG. 3B is a graphical illustration depicting exemplary logic waveforms corresponding to the sense amplifier shown in FIG. 3A, in accordance with the invention.

FIG. 3B is an illustrative logic timing diagram 360 depicting an exemplary operation of the sense amplifier circuit 300 shown in FIG. 3A. The timing diagram 360 illustrates three distinct phases of operation of the sense amplifier circuit, namely, a pre-charge operation, a read operation, and a write-back operation, in accordance with the present invention. In particular, the timing diagram 360 illustrates how control signals BIASA and BIASB work in conjunction with a selected word line, WL, and a selected write word line, WWL, to read a datum from a selected memory cell and to write the datum back to the selected memory cell.

FIG. 4A is a schematic diagram illustrating at least a portion of an exemplary sense amplifier circuit 400, formed in accordance with a third embodiment of the present invention. As apparent from the figure, the sense amplifier circuit 400 is essentially the same as sense amplifier circuit 200 shown in FIG. 2A, except that the load 252 in sense amplifier circuit 200 has again been modified in sense amplifier circuit 400 to incorporate the functions of the half-state reference generator 254, as well as additional features which will be described below. Specifically, sense amplifier circuit 400 includes a load circuit 401 which is operative to provide independent control of the gates of PMOS load devices 206, 208 for the purpose of enabling at least two operational modes, namely, an amplifying mode and a latching mode.

The load circuit 401 preferably comprises first and second PMOS load devices 206, 208, and a PMOS load enable device 402. A source of each device 206, 208 is connected to a drain of device 402 at node N3, a drain of device 206 is connected to complement bank bit line, KBLC, at node N1, a drain of device 208 is connected to true bank bit line, KBLT, at node N2, a source of device 402 connects to VDD, and a gate of device 402 receives a first control signal LOADN for selectively enabling the load circuit 401. The voltages on nodes N4 and N5, which are preferably generated by a feedback circuit 403, provide independent control of PMOS load devices 206 and 208, respectively. Feedback circuit 403 performs multiple functions by controlling the gate voltages of load devices 206, 208, including: (i) generating a half-state reference, (ii) providing a pull-up load for a corresponding block circuit, (iii) providing positive feedback for the latching mode, and (iv) providing pre-charge for the bank bit lines.

Feedback circuit 403 preferably comprises first and second NMOS transistor devices 404 and 406, respectively, and a pair of cross-coupled NMOS transistor devices 408 and 410. A drain of device 404 is connected to the gate of load device 206 at node N4, a gate of device 404 receives a second control signal, FEEDBN, and a source of device 404 receives a third control signal, BIASA. A drain of device 406 is connected to the gate of load device 208 at node N5, a gate of device 406 is connected to the gate of device 404, and a drain of device 406 receives a fourth control signal, BIASB. A drain of device 408 is connected to the drain of device 404 at node N4, a gate of device 408 receives a fifth control signal, FEEDB, which is preferably a complement of signal FEEDBN (during read, write and write-back modes of operation), and a source of device 408 is connected to true bank bit line KBCLT at node N2. A drain of device 410 is connected to the drain of device 406 at node N5, a gate of device 410 is connected to the gate of device 408, and a source of device 410 is connected to complement bank bit line KBLC at node N1. Control signals BIASA, BIASB preferably control a magnitude of the half-state reference current in the sense amplifier circuit 400 and are generated by a switched voltage bias network 412, in a manner similar to that described above in connection with FIG. 3A. Signals LOADN, FEEDB, FEEDBN, BIASA, and BIASB predominantly control the operation of the sense amplifier circuit 400. It is to be understood that the present invention is not limited to the particular sense amplifier circuit arrangement shown.

The amplifying mode of operation of sense amplifier circuit 400 is preferably substantially identical to the operation of sense amplifier circuits 200 and 300 depicted in FIGS. 2A and 3A, respectively, wherein the PMOS load devices 206, 208 are operative to pull up the true and complement bank bit lines KBLT, KBLC toward VDD. However, once the logical state of a selected memory cell is established, the load 401 preferably switches from the amplifying mode, which has no positive feedback, to the latching mode. In the latching mode, one of the two PMOS load devices 206, 208 is preferably turned off, via feedback circuit 403, through positive feedback from the bank bit lines KBLC, KBLT. This prevents DC current from flowing between VDD and ground through an electrical path otherwise formed through one of the PMOS load devices 206, 208, through at least one of the block read transistors 210, 212 (see FIG. 1), through one of cross coupled NMOS devices 210, 212 in the second stage sense amplifier, and returning to ground.

The sense amplifier circuit 400 exhibits improved noise immunity compared to the sense amplifier circuit embodiments shown in FIGS. 2A and 3A, in at least one respect, by providing a more robust logic "0" voltage (e.g., substantially close to ground), as is desirable for performing a write-back into a selected memory cell. This is primarily due to the fact that, during a read or write operation, one of the PMOS load devices 206, 208 can be disabled, through feedback of the logic state from the corresponding bank bit lines, thereby eliminating contention between a pull-up transistor, for example device 206, and a pull-down transistor, for example cross coupled NMOS device 210 or a corresponding block read transistor. In sense amplifier circuits 200, 300 (FIGS. 2A and 3A), the load PMOS devices 206, 208 are not disabled during a memory access, thus creating a contention between active pull-up and pull-down transistors which results in a write-back voltage for a logic "0" state that is above ground. The sense amplifier circuit 400 advantageously reduces power consumption compared to sense amplifier circuits 200, 300, primarily due to the use of feedback for eliminating contention between a pull-up transistor (e.g., device 206) and a pull-down transistor (e.g., device 210) during write-back.

In actuality, although having a logic "0" voltage that is above ground may slightly narrow the absolute noise margin between a logic "0" state and a logic "1" state stored in a selected memory cell, for some cases, this is not significantly detrimental to the hierarchical bit line sensing arrangement of the present invention primarily due to the presence of the block read transistor which introduces a nonlinear threshold for signal amplification. The voltage that represents a logic "0" state must rise to a level above the threshold voltage of the block read transistor (e.g., about 300 millivolts) before it can significantly influence the voltage on the bank bit lines KBLC, KBLT.

Figure 4B:
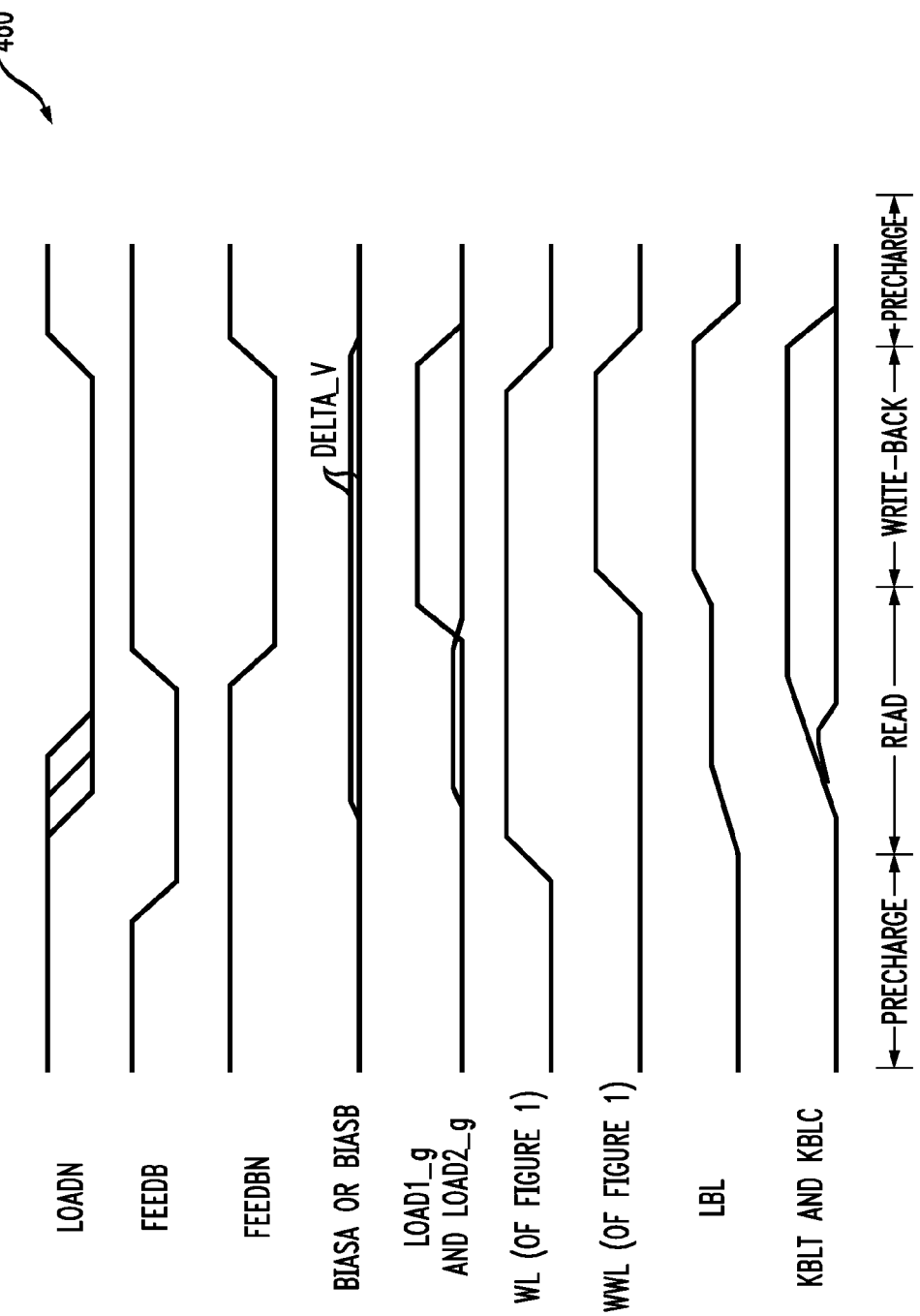
FIG. 4B is a graphical illustration depicting exemplary logic waveforms corresponding to the sense amplifier shown in FIG. 4A, in accordance with the invention.

FIG. 4B is an illustrative logic timing diagram 460 depicting an exemplary operation of the sense amplifier circuit 400 shown in FIG. 4A. The timing diagram 460, like timing diagrams 260 and 360, illustrates three distinct phases of operation of the sense amplifier circuit 400, namely, a pre-charge operation, a read operation, and a write-back operation, in accordance with the present invention. In particular, the timing diagram 460 illustrates how control signals LOADN, FEEDB, FEEDBN, BIASA and BIASB work in conjunction with a selected word line, WL, and a selected write word line, WWL, to read a datum from a selected memory cell and to write the datum back to the selected memory cell.

In accordance with another aspect of the present invention, the function of the second stage sense amplifier, comprising cross-coupled NMOS devices 210, 212, in a given sense amplifier circuit (e.g., 200, 300, or 400) can be realized using inactive block circuits within the memory circuit 100 (see FIG. 1). A block circuit is inactive when the memory cells therein are unselected (e.g., disabled).

Figure 5:
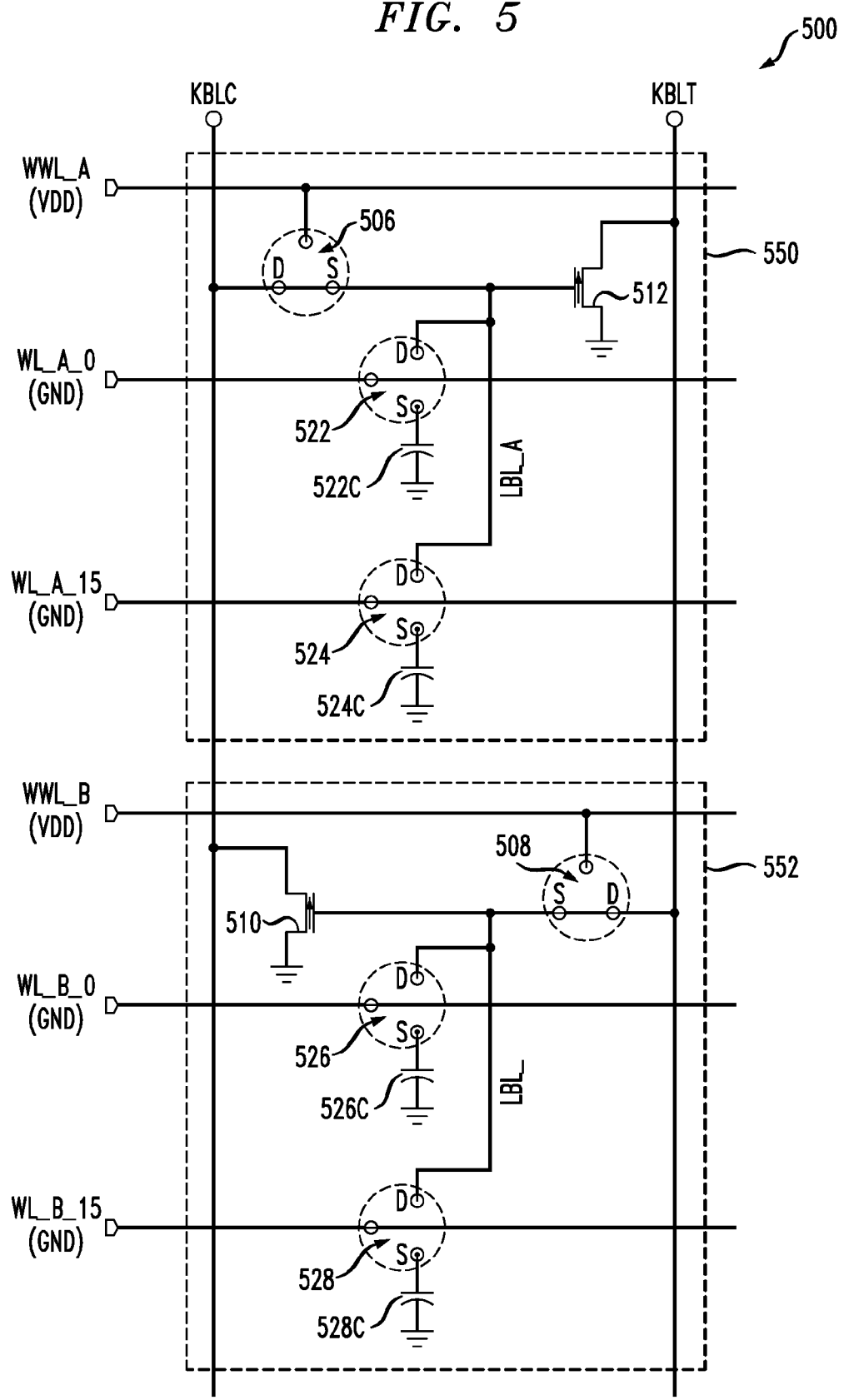
FIG. 5 is a schematic diagram illustrating a second stage sense amplifier, as employed in the exemplary sense amplifier circuits of FIGS. 2A, 3A and 4A, implemented using at least a portion of the exemplary memory circuit shown in FIG. 1, in accordance with another aspect of the present invention.

FIG. 5 is a schematic diagram illustrating a second stage sense amplifier 500, as employed in the exemplary sense amplifier circuits shown in FIGS. 2A, 3A and 4A. Rather than using a pair of additional cross-coupled NMOS transistor devices 210, 212, the second stage sense amplifier 500 can be implemented using at least two inactive block circuits in the exemplary memory circuit 100 shown in FIG. 1, in accordance with another aspect of the present invention. As apparent from the figure, two arbitrary and inactive block circuits 550, 552 sharing a common pair of bank bit lines, KBLC and KBLT, in the memory circuit have been configured to replace the cross-coupled NMOS devices 210, 212 forming the second stage sense amplifier 500 in an exemplary sense amplifier circuit (e.g., 200, 300, 400).

Block circuit 550, like the block circuits described in conjunction with the illustrative memory circuit 100 depicted in FIG. 1, includes a block write transistor 506 connected to complement bank bit line KBLC, a block read transistor 512 connected to true bank bit line KBLT, and a plurality of memory cells comprising access transistors 522 and 524, and corresponding storage capacitors 522c and 524c, connected to a local bit line, LBL_A. Word lines WL_A_0 and WL_A_15 are used to select the respective memory cells in block circuit 550, and write word line WWL_A is used to enable block circuit 550. Likewise, block circuit 552 includes a block write transistor 508 connected to true bank bit line KBLT, a block read transistor 510 connected to complement bank bit line KBLC, and a plurality of memory cells comprising access transistors 526 and 528, and corresponding storage capacitors 526c and 528c, connected to a common local bit line, LBL_B. Word lines WL_B_0 and WL_B_15 are used to select the respective memory cells in block circuit 552, and write word line WWL_B is used to enable block circuit 552.

To implement the second stage sense amplifier 500 using inactive block circuits 550, 552, all the word lines WL_A_0, WL_A_15, WL_B_0, WL_B_15 connecting to the block circuits 550, 552 are preferably grounded, so that the storage capacitors 522c, 524c, 526c, 528c are effectively disconnected from their respective local bit lines LBL_A, LBL_B. Since the memory cells 522/522c, 524l524c, 526/526c, 528/528c are disabled, their respective logic states cannot be altered by voltages applied to the local bit lines LBL_A, LBL_B. The write word lines WWL_A, WWL_B, on the other hand, are preferably set to VDD at some point during the sensing operation to shunt complement bank bit line KBLC to the gate of block read transistor 512 and to shunt true bank bit line KBLT to the gate of block read transistor 510. For ease of explanation, each of transistors 522, 524, 526, 528 is shown as dotted a circle having an open drain, indicating an inactive device, and each of transistors 506, 508 is depicted as a dotted circle having a drain shorted to its source, indicating an active device. In this manner, block read transistor 512, for the duration of the sensing operation, performs the function of cross-coupled NMOS device 212, and likewise, block read transistor 510, for the duration of the sensing operation, performs the function of cross-coupled NMOS device 210. If the strength of the block read transistors are insufficient for amplification, it is contemplated that more than two block circuits can be enabled to provide additional gain.

The techniques of the present invention described herein, specifically, exemplary sense amplifiers 200, 300 and 400 depicted in FIGS. 2A, 3A and 4A, respectively, can also be used, with or without modification, to detect the logic states of individual memory cells known as gain cells. Gain cells are well known by those skilled in the art. The conductance of these gains cells varies as a function of their stored logic states.

At least a portion of the memory circuit and/or sense amplifier circuits of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A sense amplifier circuit for use in a memory circuit including multiple pairs of differential bit lines, the sense amplifier circuit comprising:

a read and write port for selectively accessing the sense amplifier circuit in response to a first control signal;

a differential load connected between a first voltage source supplying a first voltage and a given pair of differential bit lines, the differential load being selectively activated in response to a second control signal, the differential load comprising first and second PMOS transistor devices, sources of the first and second PMOS transistor devices connecting to the first voltage source, gates of the first and second PMOS transistor devices receiving the second control signal, a drain of the first PMOS transistor device connecting to a first bit line of the given pair of differential bit lines, and a drain of the second PMOS transistor device connecting to a second bit line of the given pair of differential bit lines;

a second stage sense amplifier connected to the given pair of differential bit lines, the second stage sense amplifier comprising first and second NMOS transistor devices, a drain of the first NMOS transistor device connecting to the first bit line of the given pair of differential bit lines, a drain of the second NMOS transistor device connecting to the second bit line of the given pair of differential bit lines, a gate of the first NMOS transistor device being connected to the drain of the second NMOS transistor device, a gate of the second NMOS transistor device being connected to the drain of the first NMOS transistor device, and sources of the first and second transistor devices connecting to a second voltage source supplying a second voltage level;

a half-state reference generator connected to the given pair of differential bit lines, the half-state reference generator generating a reference current which is selectively pulled from one of the bit lines in the given pair of differential bit lines in response to a third control signal, a magnitude of the reference current generated by the half-state reference generator being controlled as a function of a fourth control signal, the half-state reference generator comprising third, fourth and fifth NMOS transistor devices, a drain of the third NMOS transistor device connecting to the first bit line of the given pair of differential bit lines, a source of the third NMOS transistor device being connected to a source of the fourth NMOS transistor device and a drain of the fifth NMOS transistor device, a gate of the third NMOS transistor device receiving a logical complement the third control signal, a drain of the fourth NMOS transistor device connecting to the second bit line of the given pair of differential bit lines, a gate of the fourth NMOS transistor device receiving the third control signal, a source of the fifth NMOS transistor device connecting to the second voltage source, and a gate of the fifth NMOS transistor device receiving the fourth control signal for controlling a magnitude of the reference current; and a pre-charge circuit connected to the given pair of differential bit lines, the pre-charge circuit being operative to set the given pair of differential bit lines to a known voltage level prior to a read or write operation in the memory circuit;

wherein the sense amplifier circuit is operative in conjunction with a first stage sense amplifier in the memory circuit, the sense amplifier circuit being configured such that activation of the second stage sense amplifier is delayed relative to activation of the first stage sense amplifier, the delay in activation of the second stage sense amplifier relative to the first stage sense amplifier being controlled at least in part by adjusting a threshold voltage of at least one transistor device in the second stage sense amplifier relative to a threshold voltage of at least one transistor device in the first stage sense amplifier so as to permit a voltage difference of a desired level to develop across the given pair of differential bit lines.

* * * * *